(12) United States Patent
Briër et al.

(10) Patent No.: US 8,591,277 B2
(45) Date of Patent: Nov. 26, 2013

(54) METHOD FOR MANUFACTURING AN ORGANIC ELECTROLUMINESCENT DISPLAY DEVICE, SUBSTRATE TO BE USED WITH SUCH A METHOD AND AN ORGANIC ELECTROLUMINESCENT DISPLAY DEVICE OBTAINED WITH THE METHOD

(75) Inventors: Peter Briër, Eindhoven (NL); Marinus Franciscus Johanus Evers, Heeze (NL)

(73) Assignee: OTB Group B.V. (NL)

( * ) Notice: Subject to any disclaimer, the term of this patent is extended or adjusted under 35 U.S.C. 154(b) by 2021 days.

(21) Appl. No.: 10/540,489

(22) PCT Filed: Dec. 24, 2003

(86) PCT No.: PCT/NL03/00937
§ 371 (c)(1),
(2), (4) Date: Dec. 8, 2005

(87) PCT Pub. No.: WO2004/070840
PCT Pub. Date: Aug. 19, 2004

(65) Prior Publication Data
US 2006/0153970 A1    Jul. 13, 2006

(30) Foreign Application Priority Data
Dec. 24, 2002 (NL) .................................... 1022269

(51) Int. Cl.
*H01J 9/00* (2006.01)
(52) U.S. Cl.
USPC .............................. 445/24; 313/500; 313/504
(58) Field of Classification Search
USPC .................. 313/506, 500, 504; 445/23, 24
See application file for complete search history.

(56) References Cited

U.S. PATENT DOCUMENTS 5,772,905 A    6/1998   Chou
6,005,344 A *  12/1999  Fleming ........................ 313/498
(Continued)

FOREIGN PATENT DOCUMENTS

EP    2261983 A2    12/2010
JP    10223368 A    8/1998
(Continued)

OTHER PUBLICATIONS

Xia et al., XP-000985399, Soft Lithography—Reviews, Angew. Chem. Int. Ed., pp. 551-575, (1998).

(Continued)

*Primary Examiner* — Anh Mai
*Assistant Examiner* — Andrew Coughlin
(74) *Attorney, Agent, or Firm* — Pillsbury Winthrop Shaw Pittman LLP

(57) ABSTRACT

A method for manufacturing an organic electroluminescent display device, wherein an arrangement of layers is applied to a substrate such, that in a first direction, first conductors extend as well as in a second direction, while between the intersections of the conductors an organic electroluminescent connection has been provided which, under the influence of an electric tension, emits light, the substrate being manufactured from plastic and being provided with a surface structure which forms a boundary for at least a number of the layers to be applied. The invention also provides a substrate intended for use in a method according to the invention for manufacturing an organic electroluminescent display device, wherein the substrate has been manufactured from plastic and is provided with a surface structure which forms a boundary for at least a number of the layers to be applied. The invention further provides an organic electroluminescent display device obtained with the method.

46 Claims, 20 Drawing Sheets

(56) References Cited

U.S. PATENT DOCUMENTS

| | | | |
|---|---|---|---|
| 6,084,347 A * | 7/2000 | Xu et al. | 313/503 |
| 6,153,543 A * | 11/2000 | Chesire et al. | 438/791 |
| 6,946,677 B2 * | 9/2005 | Ostergard | 257/40 |
| 2002/0055210 A1 | 5/2002 | Peng | |
| 2002/0177007 A1 | 11/2002 | Chernobrod et al. | |
| 2002/0195928 A1 | 12/2002 | Grace et al. | |
| 2003/0098647 A1 * | 5/2003 | Silvernail et al. | 313/506 |
| 2005/0170076 A1 * | 8/2005 | Seki et al. | 427/66 |

FOREIGN PATENT DOCUMENTS

| | | |
|---|---|---|
| WO | WO 9948339 A1 * | 9/1999 |
| WO | WO 99/54786 | 10/1999 |
| WO | WO 03/065474 A1 | 8/2003 |

OTHER PUBLICATIONS

European Search report for European Patent Application No. 10186196.1, mailed Sep. 7, 2011.

* cited by examiner

METHOD FOR MANUFACTURING AN ORGANIC ELECTROLUMINESCENT DISPLAY DEVICE, SUBSTRATE TO BE USED WITH SUCH A METHOD AND AN ORGANIC ELECTROLUMINESCENT DISPLAY DEVICE OBTAINED WITH THE METHOD

This is the U.S. National Stage of International Application PCT/NL 03/00937 filed Dec. 24, 2003, which claims priority to Netherlands Application 1022269 filed Dec. 24, 2002, the entire contents of both herein incorporated by reference.

The invention relates to a method for manufacturing an organic electroluminescent display device, wherein an arrangement of layers is applied to a substrate, such that in a first direction, conductors extend, as well as second conductors in a second direction, while between crossings of the first and second conductors, an organic electroluminescent compound is provided which emits light under the influence of a voltage.

The invention also relates to a substrate suitable and intended for use in a method according to the invention for manufacturing an organic electroluminescent display device, the method comprising the step of applying a first conductive layer by means of a layer application process.

With the known method for manufacturing an organic electroluminescent display device, the starting point is a substrate manufactured from glass, onto which a structure has been applied with the aid of a photoresist, provided, for instance, through spin coating, which photoresist has been locally exposed and thereupon has been locally removed with washing techniques. These processes are laborious, cost much time and hence are costly. As, in the manufacture of displays, it is the very cost price which plays a predominant part, the provision of a display device wherein such "wet" chemical steps for manufacturing the display device are omitted would be of great advantage.

To this end, according to the invention, the method of the type described in the opening paragraph is characterized in that the substrate is manufactured from plastic and has a surface structure which forms a boundary, at least for a number of the layers which are applied, a first conductive layer being applied by means of a layer application process, the surface structure of plastic substrate being provided with a shadowing structure which is such that with the layer application process, parts of this shadowing structure are hardly covered, if at all, with the respective conductive layer, the shadowing structure being such that the electrical resistance prevailing there is great relative to the resistance in the rest of the conductive layer.

Such a plastic substrate which is provided with a surface structure can be manufactured with a plastic formation process known per se such as, for instance, injection molding, embossing, photopolymeric replication or the like. Embossing has been described in, for instance, U.S. Pat. No. 4,659,407, photopolymeric replication has been described in WO 87/02934. From, for instance, the manufacture of CDs, injection molding techniques are known with the aid of which very fine submicrostructures can be manufactured in a plastic substrate at relatively very low cost prices. The need of using wet chemical techniques for forming the substrate is thereby cancelled with all associated advantages. Such fine surface structures can also be applied on a film, as is described in, for instance, WO 99/12160 or EP-A-0 408 283.

According to a further elaboration of the invention, the shadowing structure can comprise a number of parallel, narrow and deep grooves, while the width and the depth of the grooves are such that, in the layer application process, at least a part of the side walls and/or the bottom of these grooves is hardly covered, if at all, with the first conductive layer.

Such a groove structure can be designed to be such that, in a releasing manner, it can be taken from the mold in which the plastic substrate is formed. In the formation process of the plastic substrate, the shadowing structure is provided without, to that end, one single finishing step being required for the plastic substrate. Basically, the shadowing structure is obtained practically free of charge in the formation process of the plastic substrate when the mold has the right shape.

According to still another elaboration of the invention, layers can be applied with the aid of a printing operation such as, for instance, inkjet printing, silkscreen printing, electrostatic printing techniques and thermal transfer printing. In order to somewhat simplify the printing process, it can be advantageous to design the surface structure of the substrate to be such that, as it were, channels have been provided herein in which the liquids dispensed through the printing process are deposited. The walls of the respective channels form the boundaries of the liquid deposited in the channels with the printing process.

Subsequently, with printing techniques, layer application techniques such as sputtering, CVD and PECVD-techniques, layers and layer patterns can be provided with the aid of which the organic electroluminescent display device is composed. Such layers and layer patterns comprise, for instance, a PDOT- and PPV-layer in the pixel pits or sub-pixel pits, insulating layers for covering the first conductor and conductive layers for forming a number of second conductors.

According to a further elaboration of the invention, optionally, with a curing varnish, an additional relief structure can be applied to the substrate already provided with a number of layers, for forming a relief structure desired for the application of a following layer. For instance, in a simple manner, a number of new channels can be formed in which the liquid, forming the second conductors, can be deposited. This curing varnish can for instance be a UV curing varnish which is deposited locally with an inkjet printing operation. In such a manner, for instance, also the above-described shadowing structure can be removed by filling the relatively narrow and deep grooves up with UV-curing varnish.

According to an alternative, further elaboration of the invention, after application of at least one layer, the shape of the surface structure can be adapted through a transforming technique, such as, for instance, a local thermal treatment. Such a thermal treatment can, for instance, be contactlessly, via infrared radiation, or laser irradiation or with a contact treatment. Thus, for instance, the groove-shaped shadowing structures can be melted away.

According to the invention, the substrate described in the opening paragraph is characterized in that it is manufactured from plastic and has a surface structure which forms a boundary for at least for a number of the layers to be applied in the method, the surface structure of plastic substrate being provided with a shadowing structure which is such that with the layer application process, parts of this shadowing structure are hardly covered, if at all, with the respective conductive layer, the shadowing structure being such that the electrical resistance prevailing there is great relative to the resistance in the rest of the conductive layer.

Such a plastic substrate provided with a surface structure can be manufactured in one single operation in an injection molding process. This means that the cost price of the substrate can be particularly low. This in contrast with the substrates from glass used heretofore, on which, with the aid of photochemical techniques, structures have been applied.

According to a further elaboration of the invention, the surface structure can comprise a number of pixel pits or sub-pixel pits. Such pits render the deposition of liquid therein, such as for instance PDOT or PPV, with the aid of an inkjet process simple and more controllable.

Further, the surface structure can comprise a shadowing structure which is such that with a sputtering process, indirect sputtering and/or evaporation, parts of this shadowing structure are not covered with the respective conductive layer, so that the shadowing structure forms insulating tracks in the conductive layer. According to a further elaboration of the invention, the shadowing structure can be formed by a number of parallel narrow and deep grooves, while the width and the depth of the grooves is such that at least a part of the side walls and/or the bottom of these grooves are not covered with a first conductive layer in a sputtering process.

According to still a further elaboration of the invention, in the pixel pits or sub-pixel pits, a structure can be provided which influences the generated light that passes the structure. Such a structure can also be provided at the side of the substrate remote from the pixel pits or sub-pixel pits. For instance, a structure in the form of a Fresnel lens, having a converging or diverging effect on the light passing through the structure, can be considered.

Further, according to a further elaboration of the invention, in the pixel pits or sub-pixel pits, a structure can be provided which is designed for improving the distribution of liquid for forming the layers applied in the pixel pits or sub-pixel pits. It is noted that such structures, improving the distribution of liquid, can also be provided in the channels in which, through printing techniques, liquids are deposited, for a better distribution of the liquid.

According to a further elaboration of the invention, a contact surface enlarging structure can be provided in the pixel pits or sub-pixel pits. Firstly, such a contact surface enlarging structure yields a larger conductive surface so that the electrical resistance across a pixel is reduced. Moreover, a larger electroluminescent surface is created so that a greater light intensity per pixel is obtained. Optionally, the structure improving the distribution of liquid can also be combined with the contact surface enlarging structure. The structure can, for instance, comprise a number of capillary grooves.

The invention also provides an organic electroluminescent display device manufactured while using a method according to any one of claims 1-30 starting from a substrate according to any one of claims 31-44.

Figure 39A:
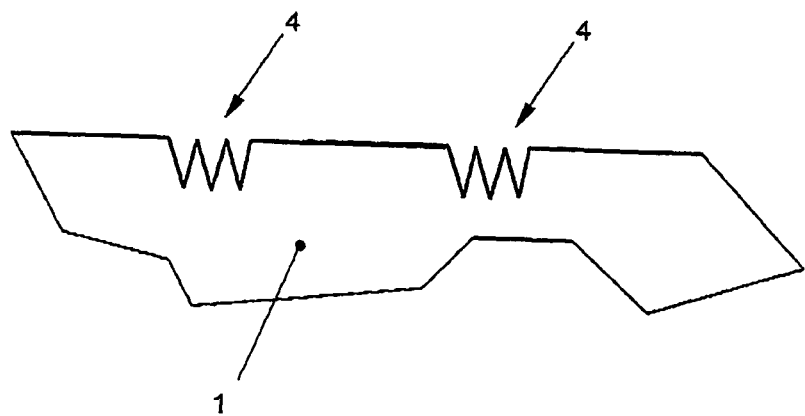
Figure 39B:
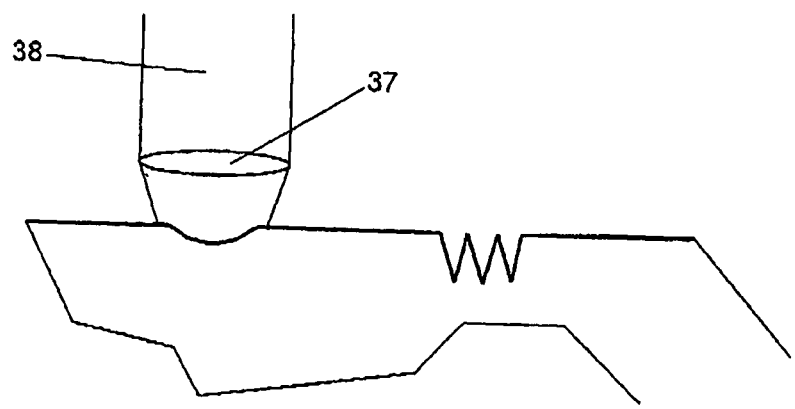

FIG. 39*a* shows a substrate with a shadowing structure provided therein; and FIG. 39*b* shows in which manner this shadowing structure can be locally removed through a thermal laser operation.

Figure 1:
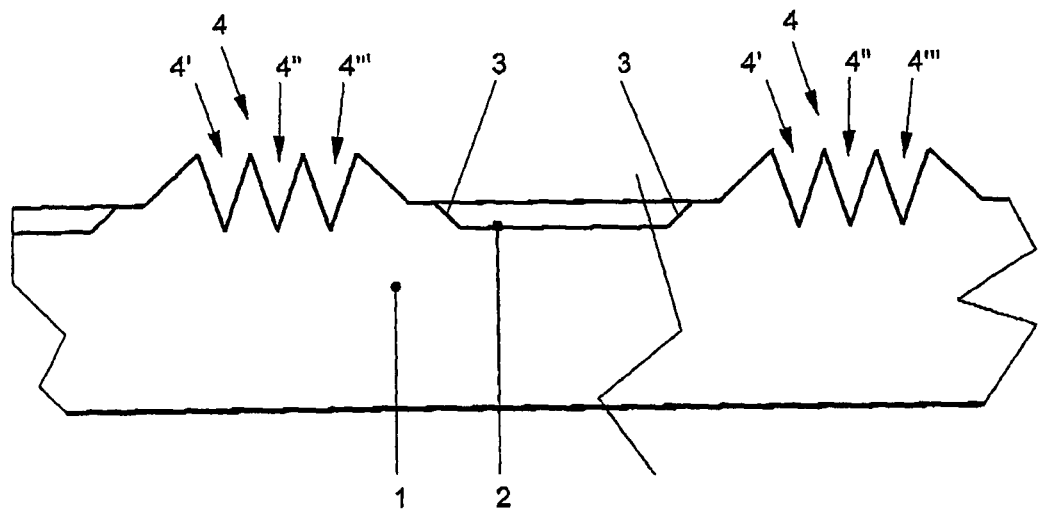
FIGS. 1-18 show the various steps of building up a first embodiment of a display device according to the invention while the Figures with the uneven Figure numbers show cross-sectional views and the Figures with even Figure numbers show top plan views.
Figure 2:
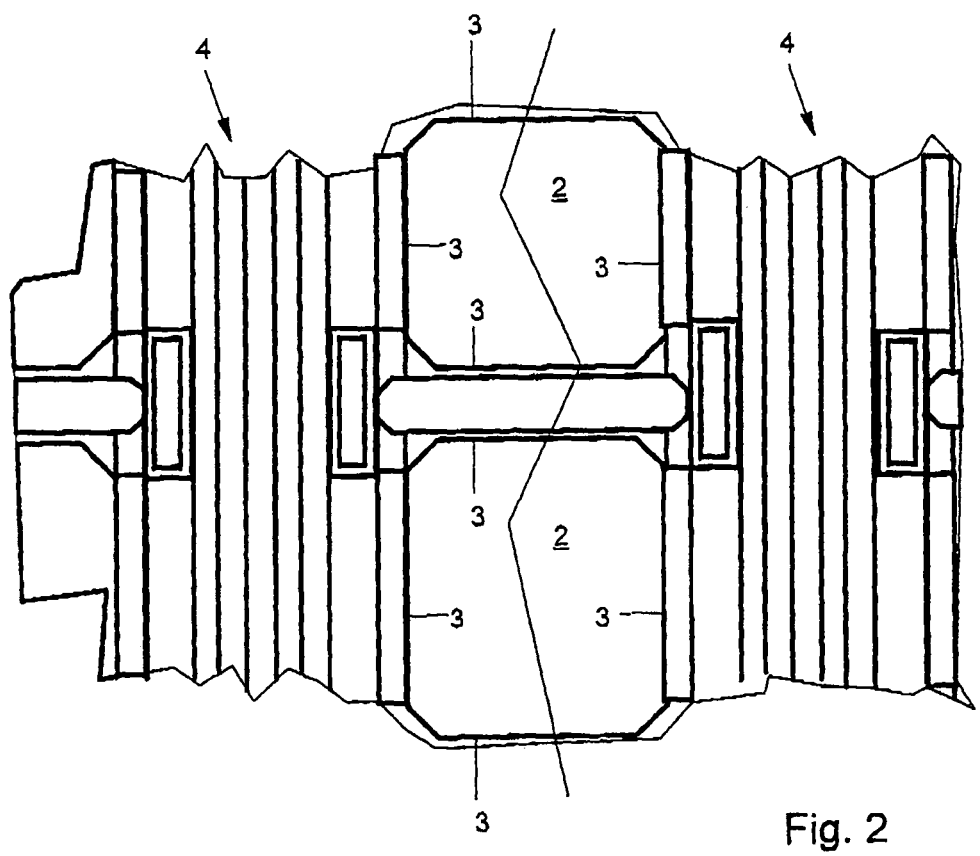

FIGS. 1 and 2 show a cross-sectional front view and a top plan view of a part of a plastic substrate 1 not yet provided with layers for manufacturing an organic electroluminescent display device. During the manufacture of the substrate, for instance with the aid of an injection molding operation, the substrate has been provided with a surface structure forming a boundary, at least for a number of the layers to be applied. For instance, pixel pits 2 are clearly visible which are bounded by pixel pit boundaries 3. The surface structure further comprises a shadowing structure 4. In the present exemplary embodiment, the shadowing structure has been designed as, each time, a number of parallel, deep, narrow grooves 4', 4", 4'''. Such a shadowing structure is such that a layer to be applied with a layer application process such as, for instance, sputtering, hardly covers, if at all, parts of the shadowing structure.

Figure 3:
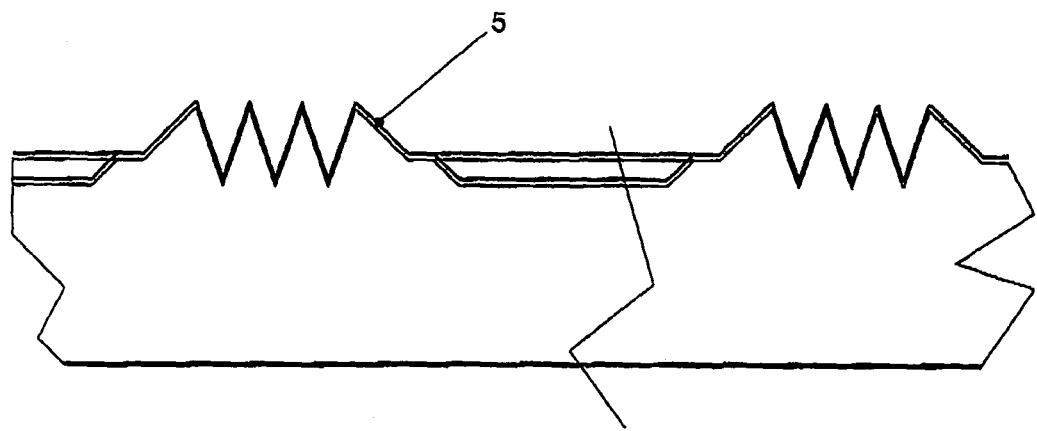
Figure 4:
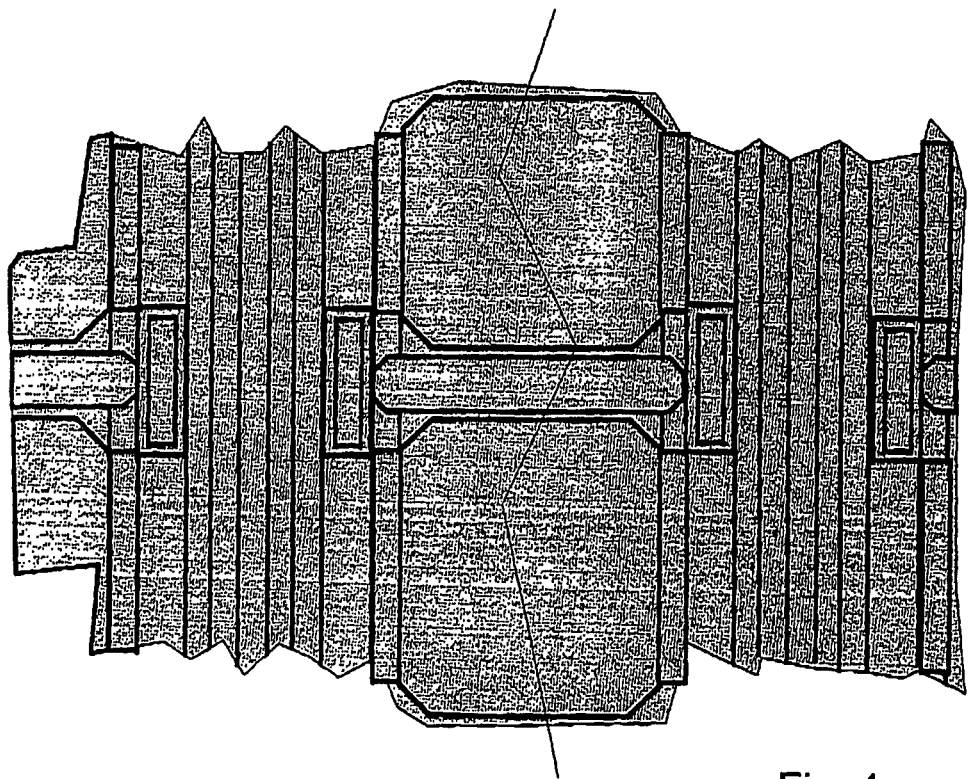

FIGS. 3 and 4 shows the same substrate which is provided with a transparent encapsulation layer 5, such as, for instance, a nitride-oxide-nitride-, or, NON-layer. Also, other transparent layers which are tight to water, oxygen and other undesired substances are among the possibilities. The transparent encapsulation layer can, for instance, be applied with a deposition technique such as a PVD-, CVD- or PECVD-process.

Figure 5:
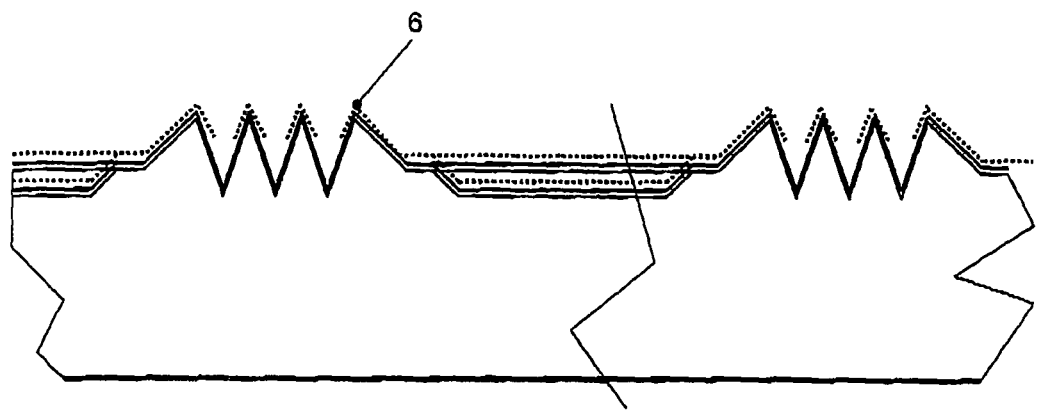
Figure 6:
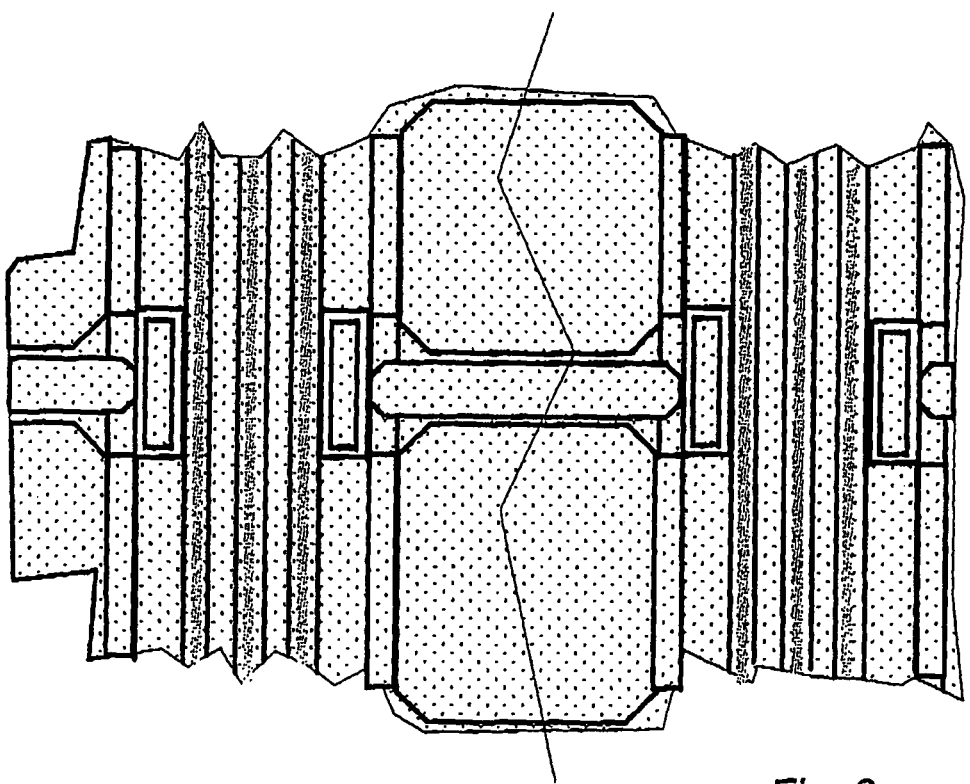
Figure 7:
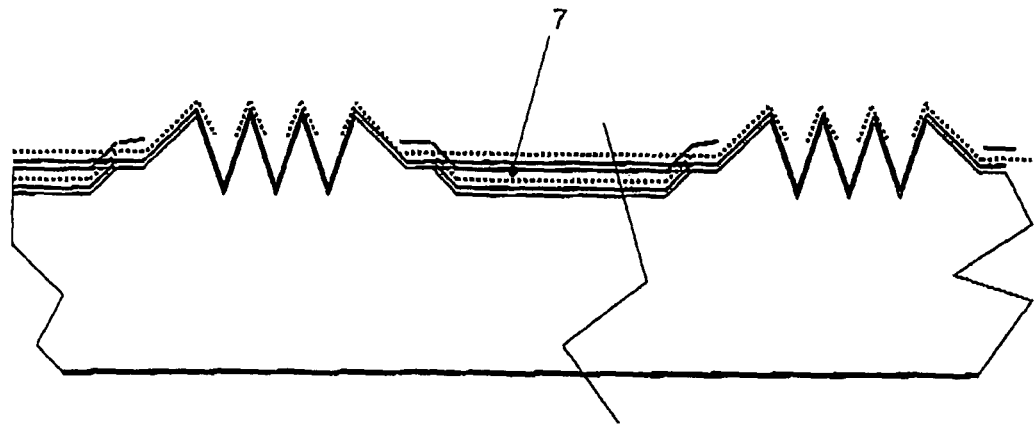
Figure 8:
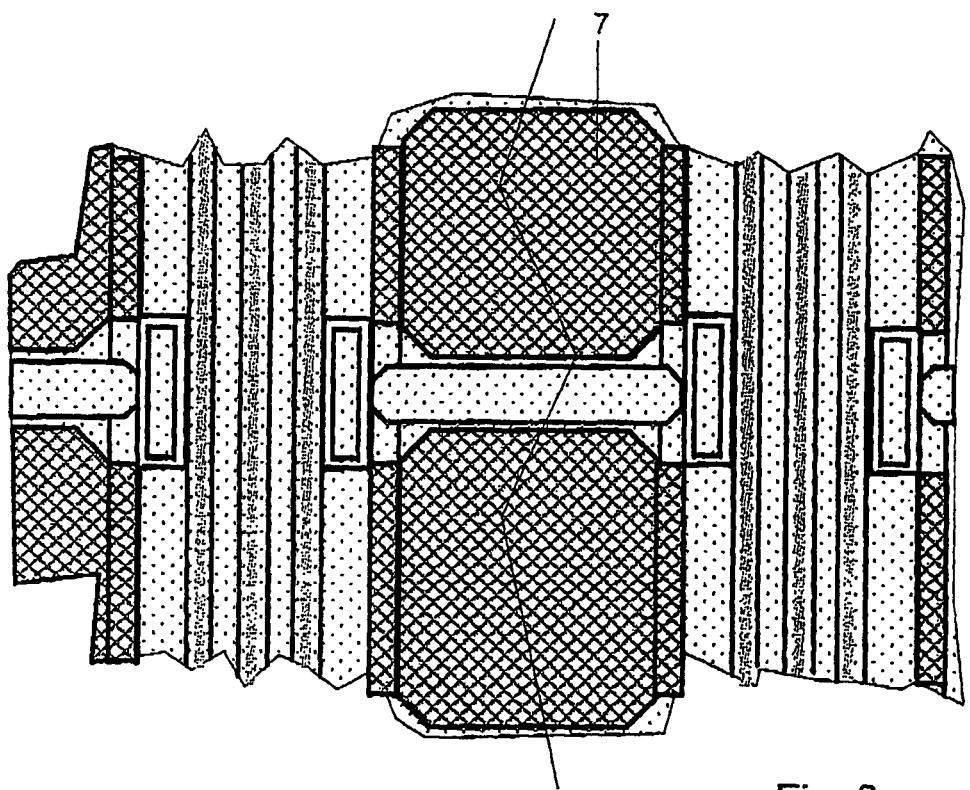

FIGS. 5 and 6 show the substrate after a first conductive layer 6 has been applied. Such layers can be applied with, for instance, a sputtering process. In the present exemplary embodiment, the first conductive layer is formed by a TCO-layer (transparent conductive oxide). Also, other conductive layers can be applied. It is clearly visible that the deep parts of the grooves 4', 4", 4''' are hardly covered, if at all, with the first conductive layer 6. In this manner therefore, parallel conductive paths are obtained insulated from each other and extending in a first direction. The Figures also clearly show that parts of the first conductors extend in pixel pits or sub-pixel pits 2 of the surface structure of the substrate 1. The first conductive layer can also be a so-called PDOT-layer. However, it is also possible that a hole injecting layer 7, such as, for instance, a PDOT-layer is applied exclusively in the pixel pits or sub-pixel pits 2. With this last-mentioned option, which is represented in FIGS. 7 and 8, the layer can for instance be deposited in the pixel pits or sub-pixel pits with a printing operation, such as for instance an inkjet operation. Since the pixel pits or sub-pixel pits 2 are bounded by pixel pit boundaries 3, the risk of the liquid forming the PDOT-layer flowing outside the pixel pits or sub-pixel pits 2 is reduced to a minimum.

Figure 9:
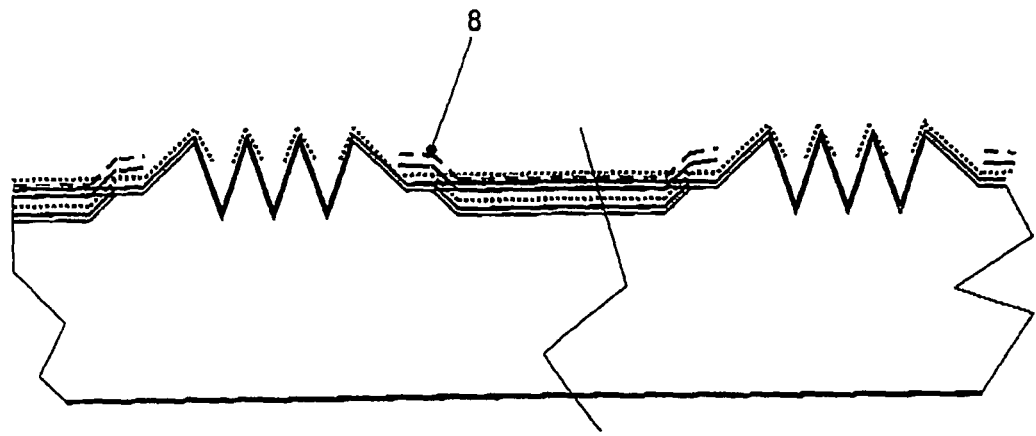
Figure 10:
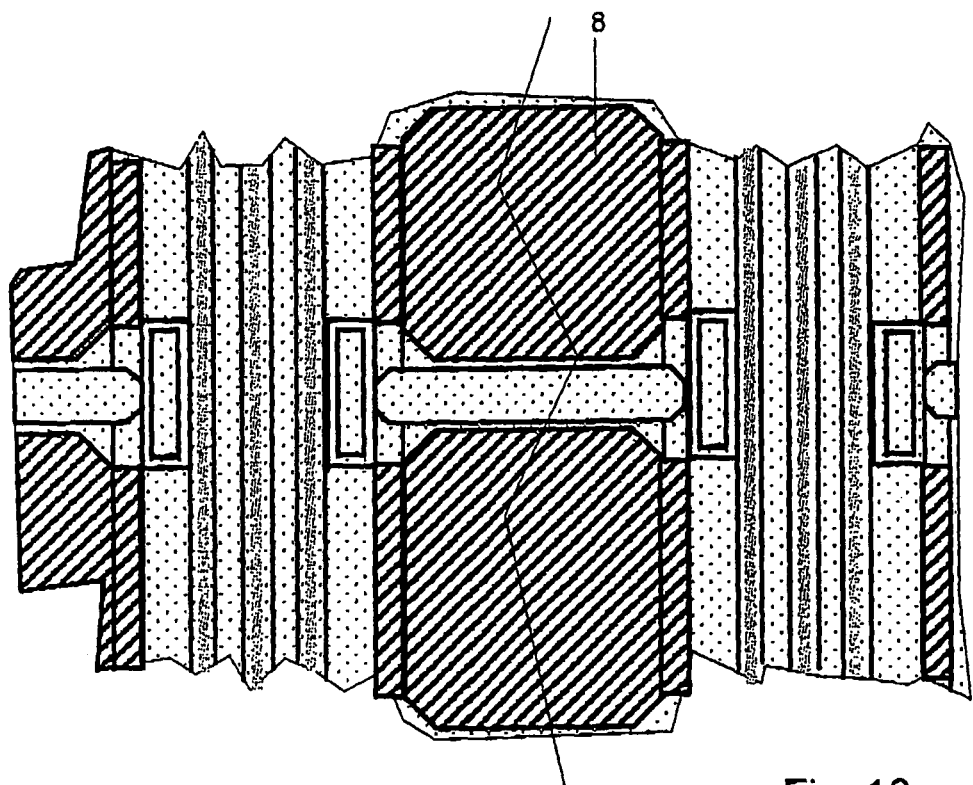

Thereupon, in FIGS. 9 and 10, it is shown that in the pixel pits or sub-pixel pits 2, further, a light emitting layer 8 is deposited, such as, for instance, a PPV-layer. This layer too can be provided with the aid of, for instance, inkjet printing.

Figure 11:
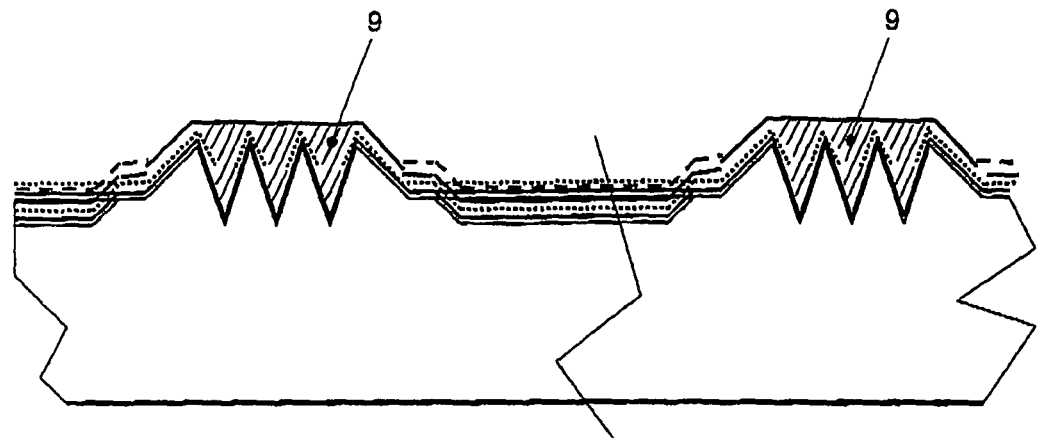
Figure 12:
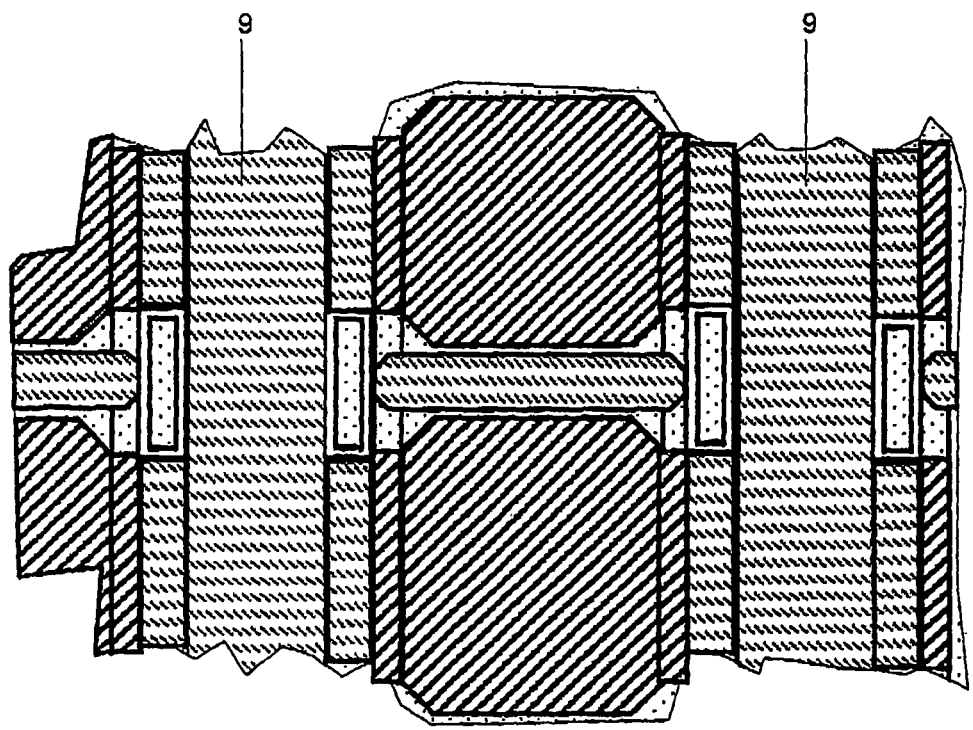

FIGS. 11 and 12 show that the shadowing structure 4 and, more in particular, the deep, narrow grooves 4', 4", 4''' are filled up with an insulating covering 9. This covering can for instance be formed by a UV-curing varnish which can be accurately applied with the aid of an inkjet printing operation. Instead thereof, the method represented in FIG. 39*b* can also be used.

Figure 13:
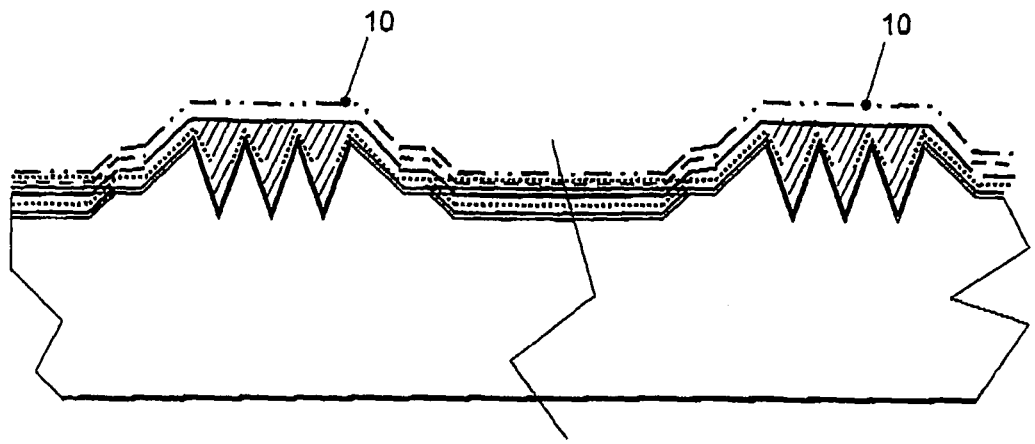
Figure 14:
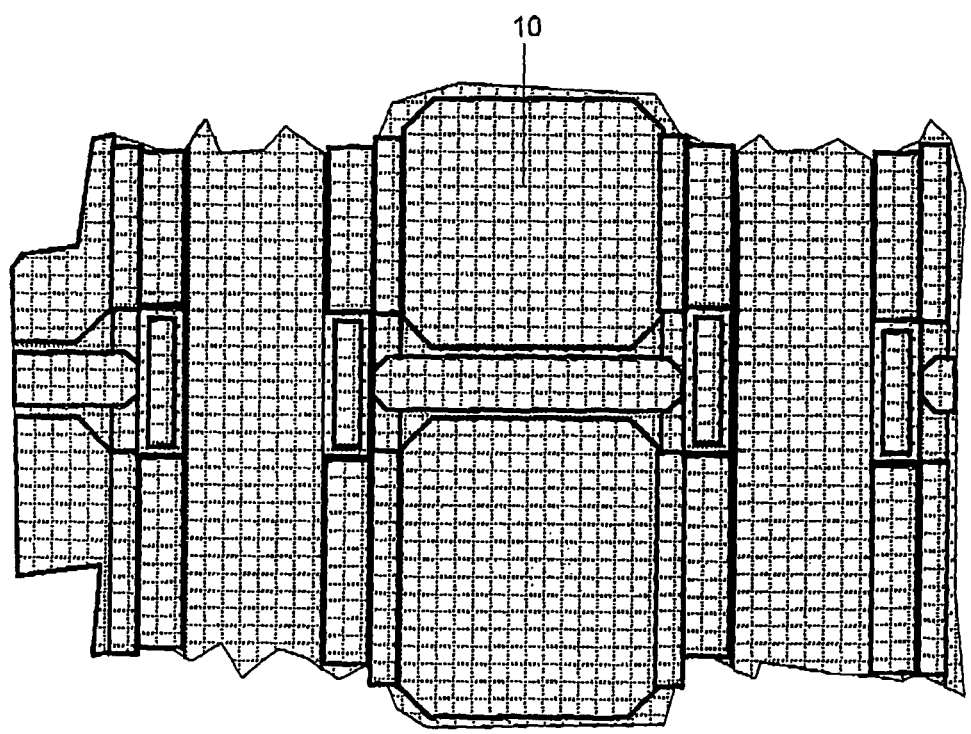
Figure 15:
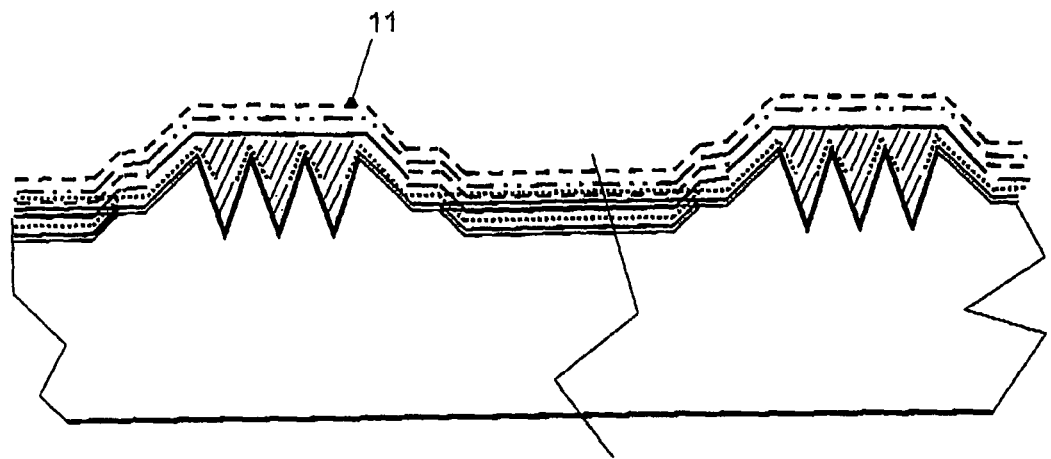
Figure 16:
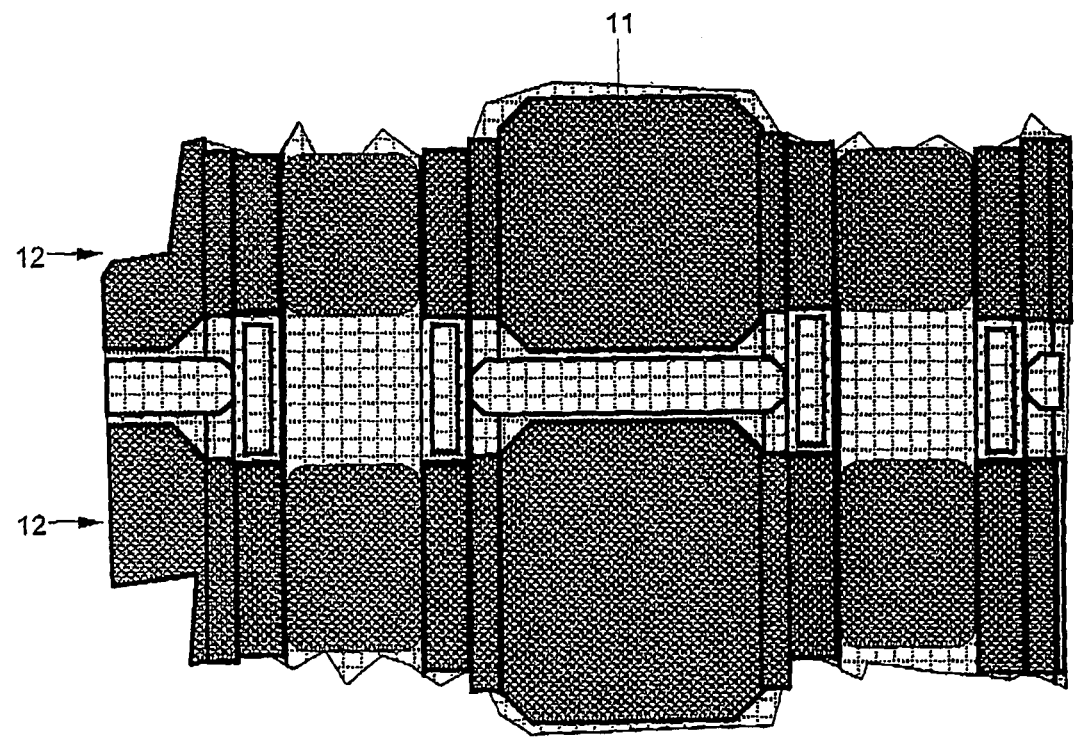

Then, as shown in FIGS. 13 and 14, the entire substrate 1 is covered with a layer of barium 10, whereupon, as shown in FIGS. 15 and 16, a second conductive layer 11 is applied such that a number of parallel conductors 12 is provided, extending in a second direction and which are mutually insulated from each other. Parts of the second conductors 12 extend in pixel pits or sub-pixel pits 2 of the surface structure of the substrate 1. In the present exemplary embodiment, the second conductors 12 extend perpendicularly to the first conductors which extend between the parallel shadowing structures 4. The second conductive-layer 11 too can be selectively applied with the aid of a printing process, such as for instance an inkjet printing operation.

Figure 17:
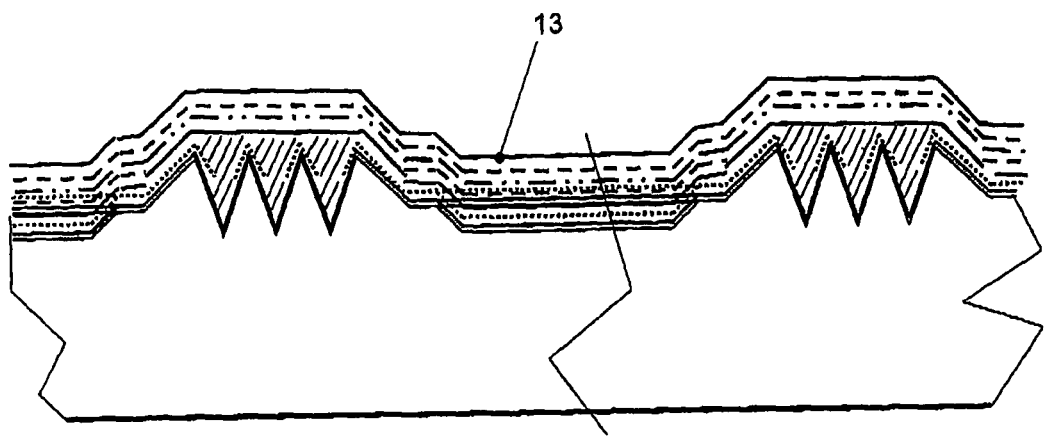
Figure 18:
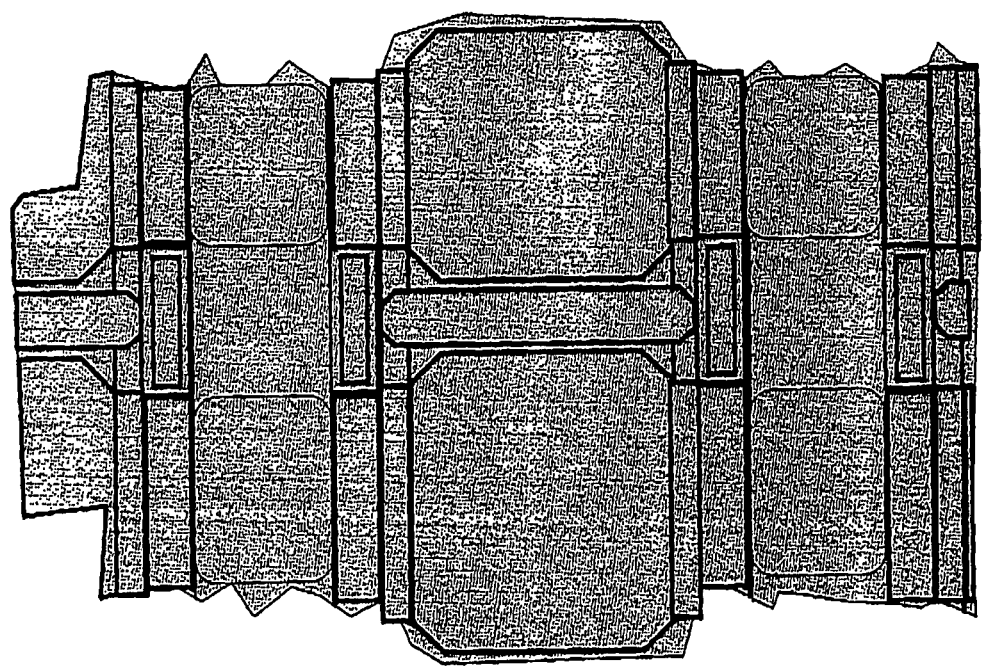

Finally, FIGS. 17 and 18 show that a second encapsulation layer 13 is applied over the entire substrate. This layer too seals off from undesired substances, such as, for instance, water, oxygen and the like.

Figure 19:
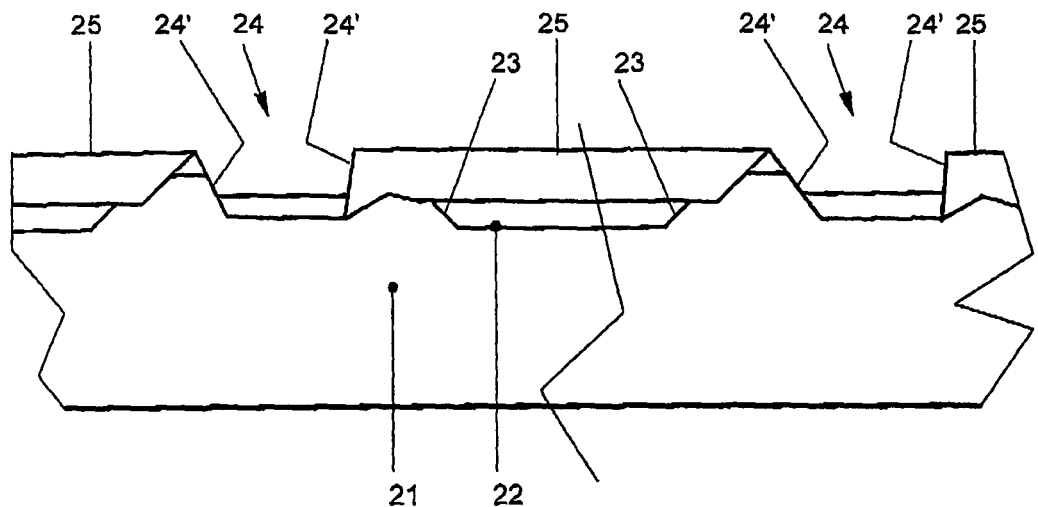
FIGS. 19-36 show the various steps of building up a second embodiment of a display device according to the invention, while the Figures with uneven Figure numbers show cross-sectional views and the Figures with even Figure numbers show top plan views.
Figure 20:
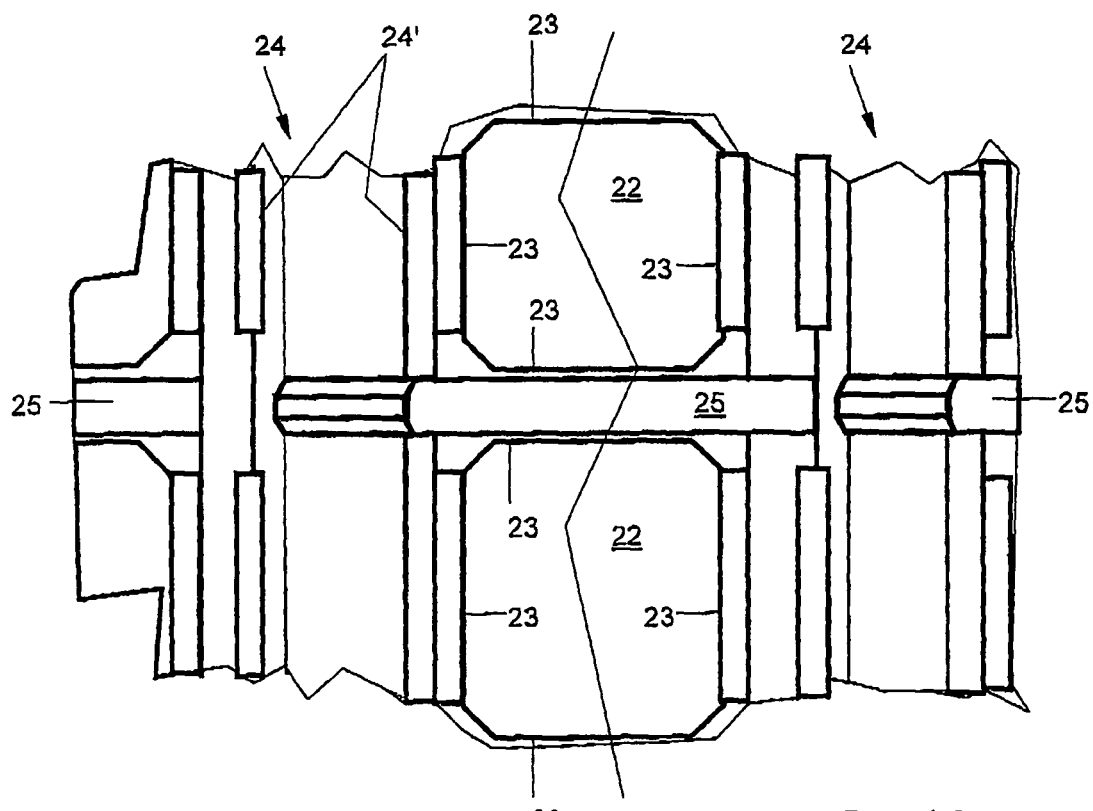

FIGS. 19 and 20 show a second embodiment of a substrate 21. In contrast to the first exemplary embodiment, this substrate has not been provided with a shadowing structure as described hereinabove. Instead thereof, a channel structure 24 with channel boundary 24' is present for a printable first conductive layer. Also, the pixel pits or sub-pixel pits 22 are clearly visible with the pixel pit boundaries 23. Further, a separating structure 25 is already partially present for a printable second conductive layer. This separating structure 25 is still interrupted at the location of the channels 24 in which the first conductive layer 27 is to be printed.

Figure 21:
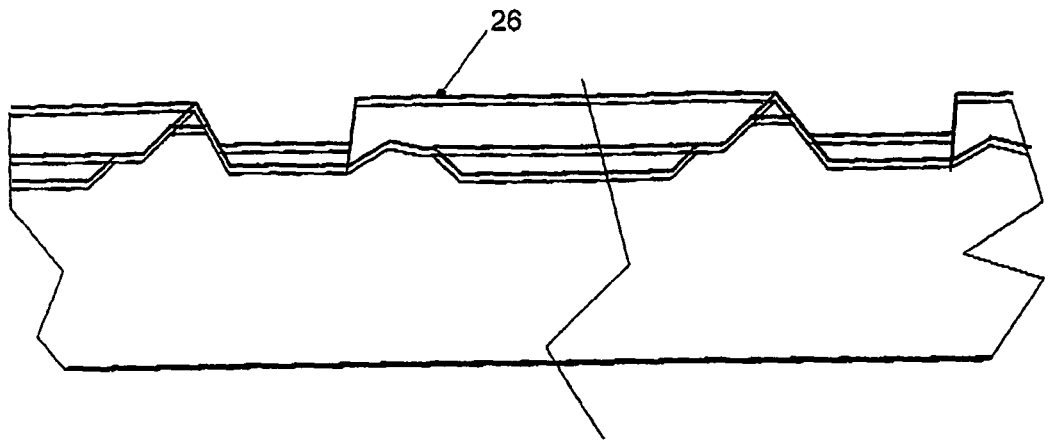
Figure 22:
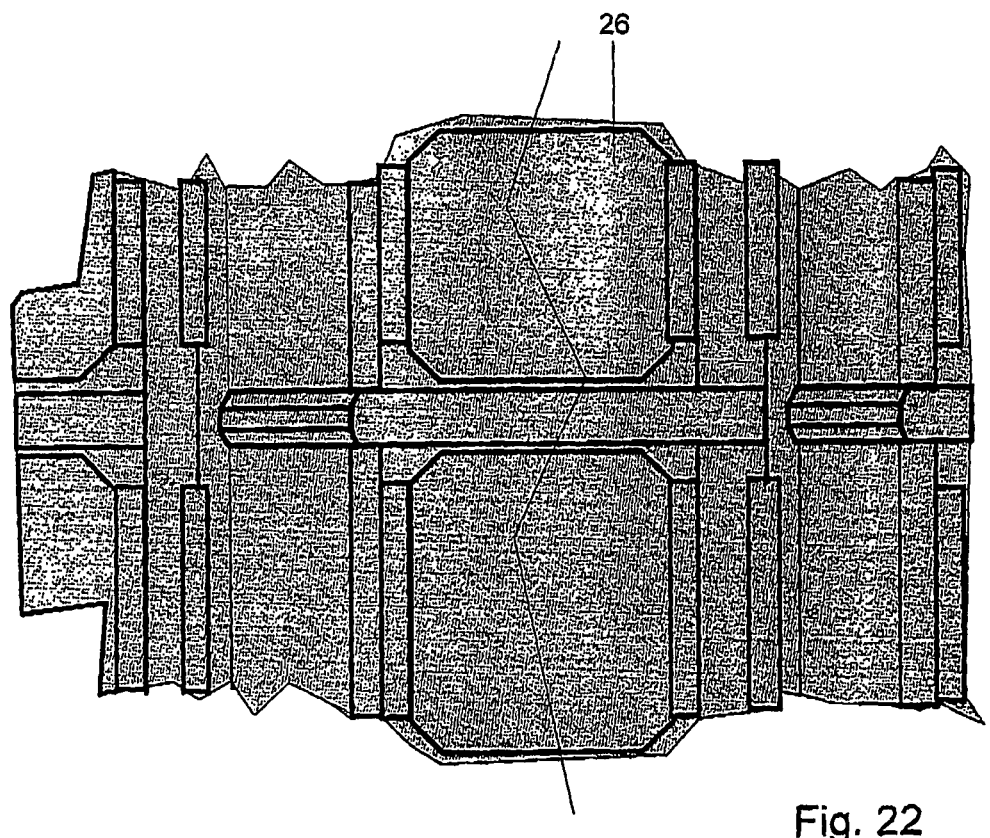

FIGS. 21 and 22 show the same substrate which is provided with a transparent encapsulation layer 26, such as, for instance, nitride-oxide-nitride, or NON-layer. Also, other transparent layers which are tight to water, oxygen and other undesired substances are among the possibilities. The transparent encapsulation layer 26 can, for instance, be applied through an evaporation technique such as a CVD- or PECVD-process.

Figure 23:
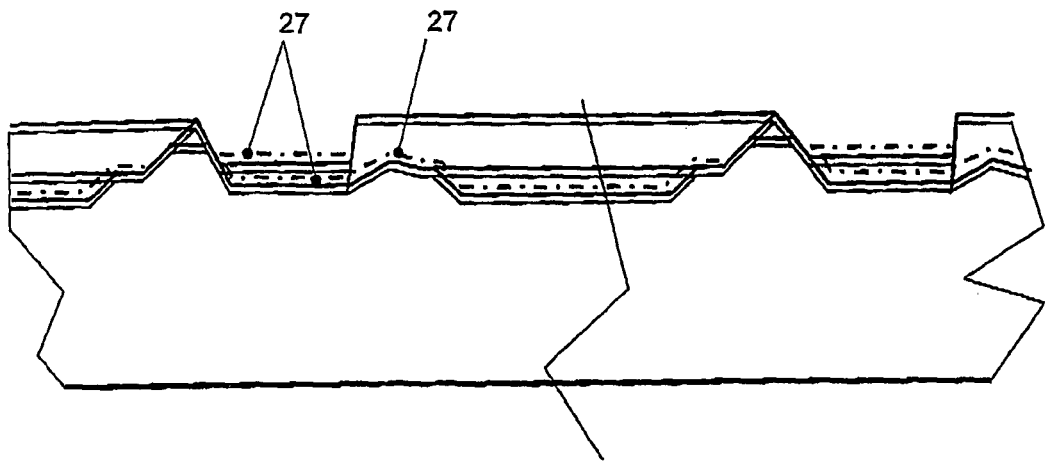
Figure 24:
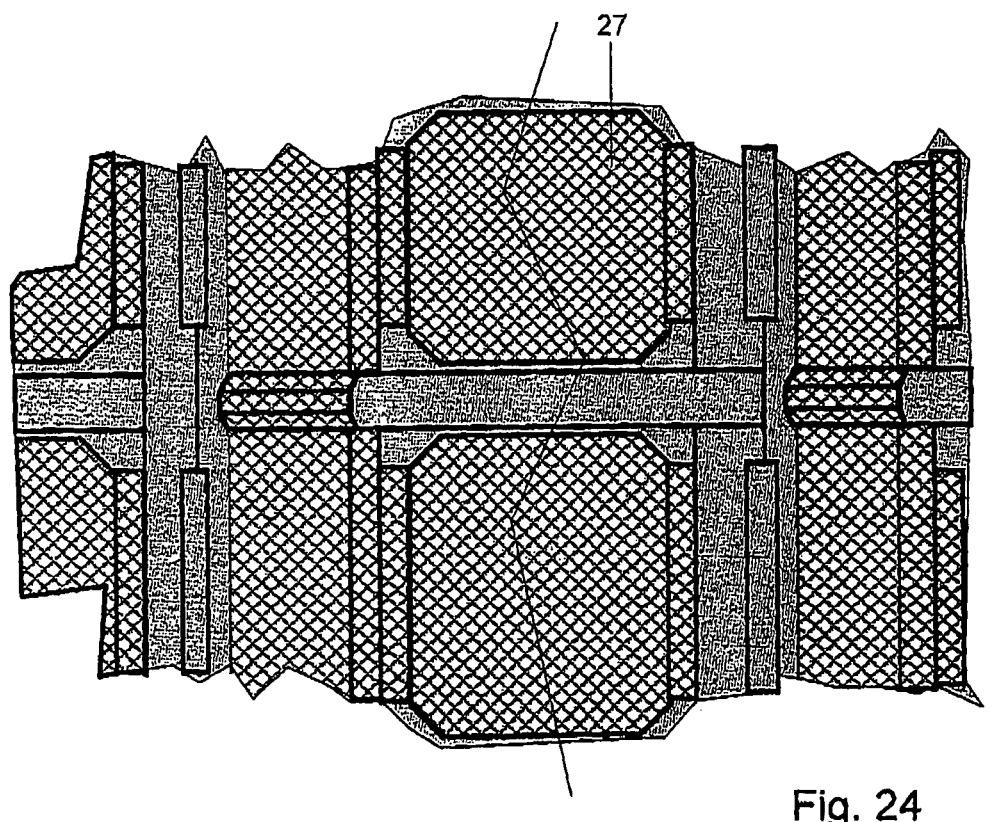

FIGS. 23 and 24 show a printed first conductive layer 27. It is clearly visible that the first conductive layer 27 extends in the channel structure 24 intended thereto and in the pixel pits or sub-pixel pits 12. In the present exemplary embodiment, the first conductive layer 27 is formed by a PDOT-layer which has been provided on the desired location with the aid of an inkjet printing operation. The channel structure boundary 24' and the pixel pit boundary 23 ensure that the liquid does not flow outside the desired areas.

Figure 25:
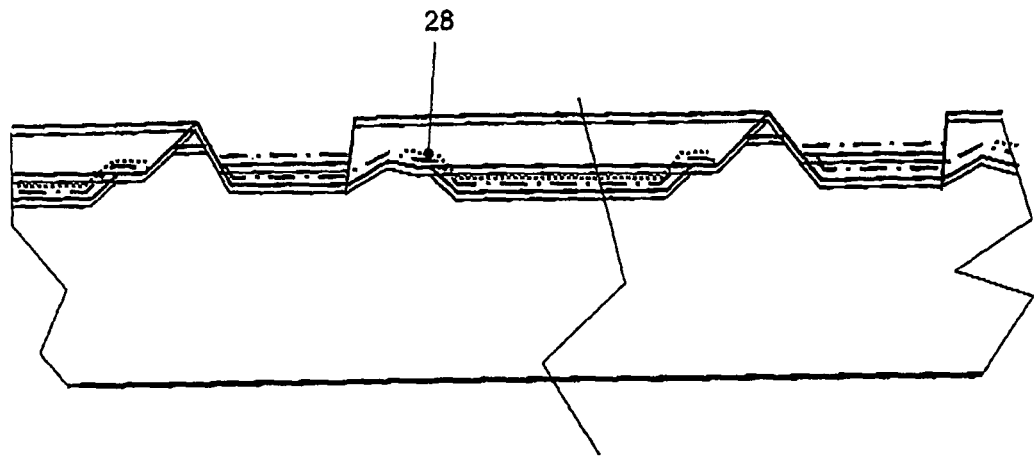
Figure 26:
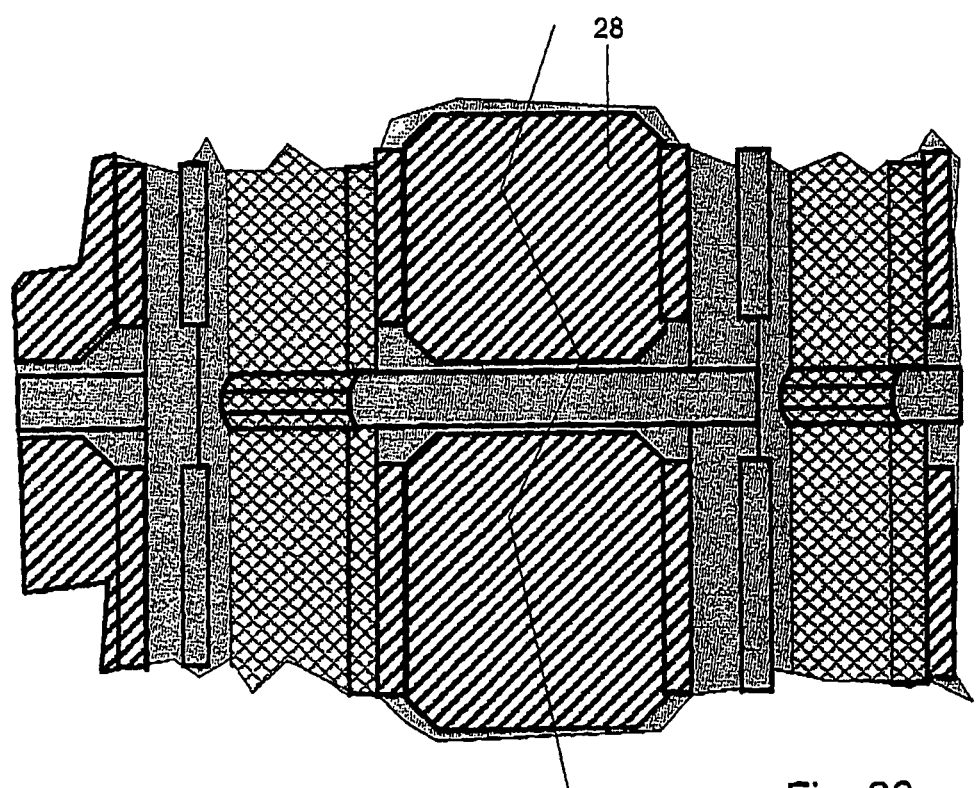

FIGS. 25 and 26 show that in the pixel pits or sub-pixel pits 22, further, a light emitting layer 28 is deposited, such as, for instance, a PPV-layer. This layer 28 too can be provided with for instance inkjet printing.

Figure 27:
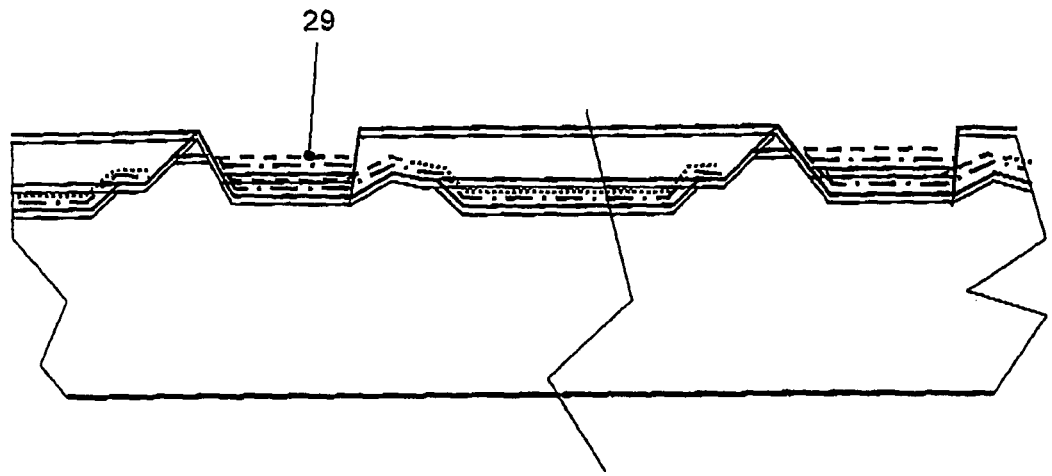
Figure 28:
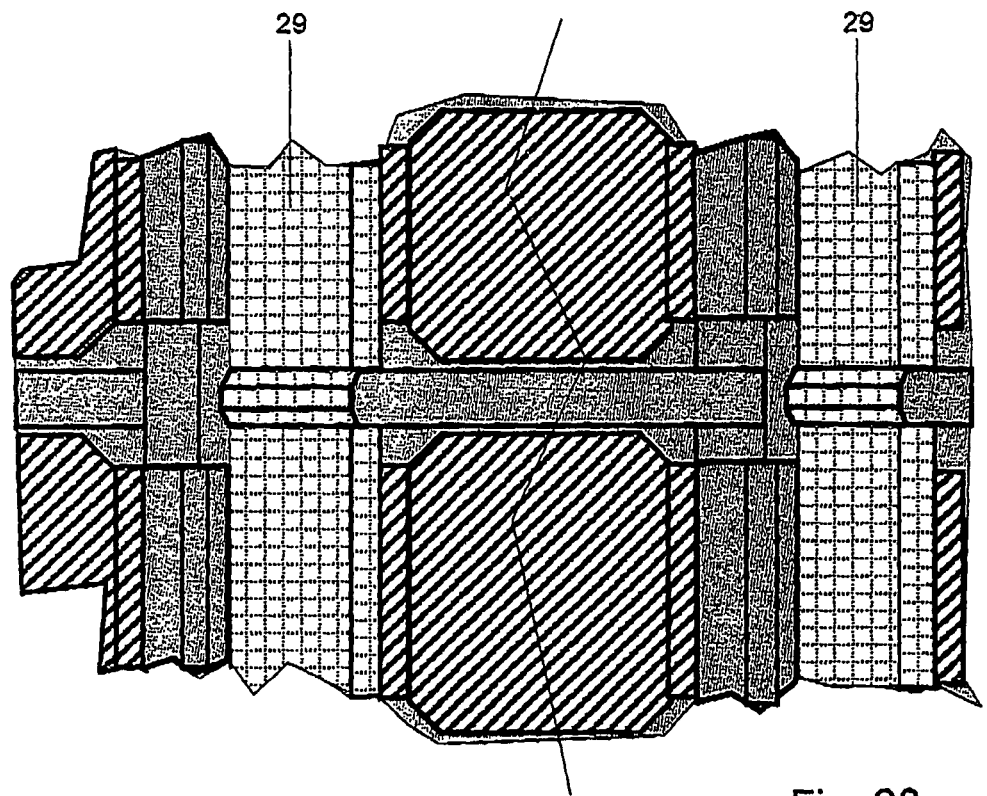

In FIGS. 27 and 28 it is shown that across the channel structure 24, an insulating covering 29 has been provided. The insulating covering 29 can for instance be formed by a UV-varnish or photoresist varnish.

Figure 29:
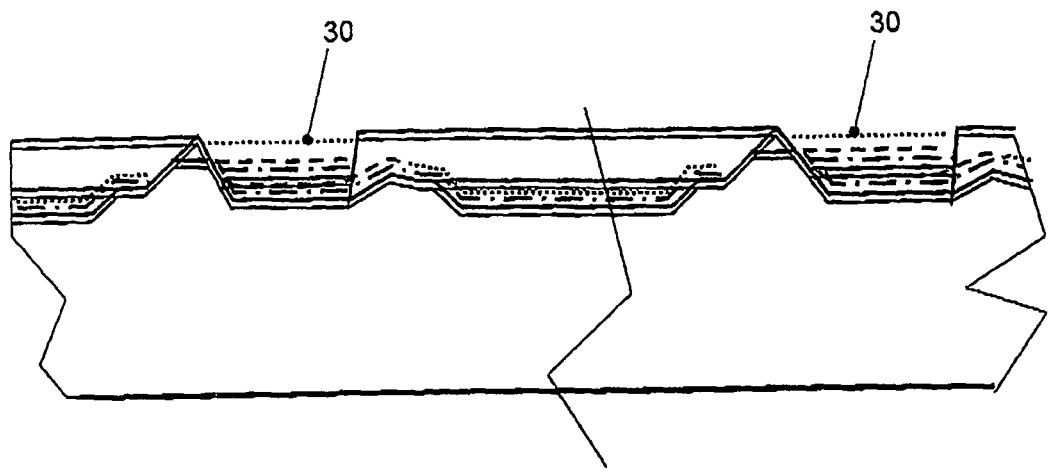
Figure 30:
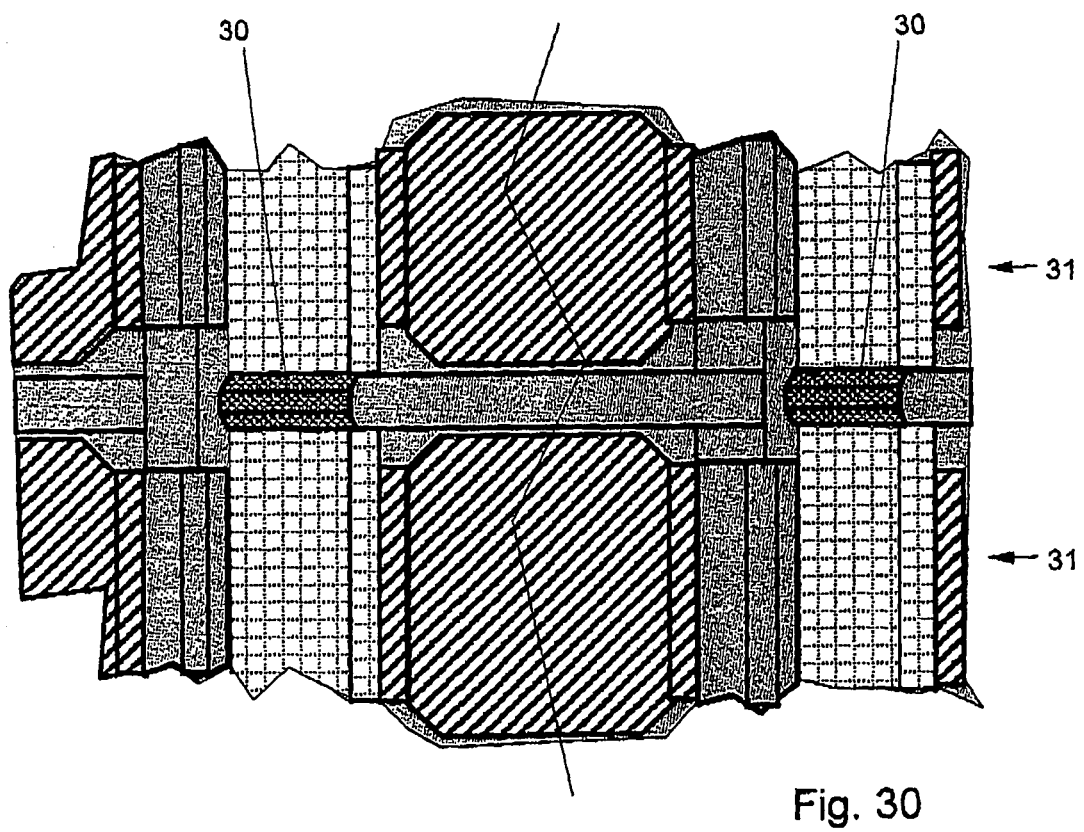

FIGS. 29 and 30 show that the separating structure 25 has also been provided in the channel structure 24 through the provision of a threshold 30 therein. The additional relief structure is therefore provided on the substrate already provided with a number of layers for forming a relief structure desired for applying a following layer. In the present exemplary embodiment, the additional relief structure 30 is provided with the aid of a printing operation, while using a curing varnish, for instance a UV-curing varnish. Thus, channels 31 are formed, extending parallel to each other, while the channel direction is perpendicular to the first direction mentioned in which the first conductors 27 extend.

Figure 31:
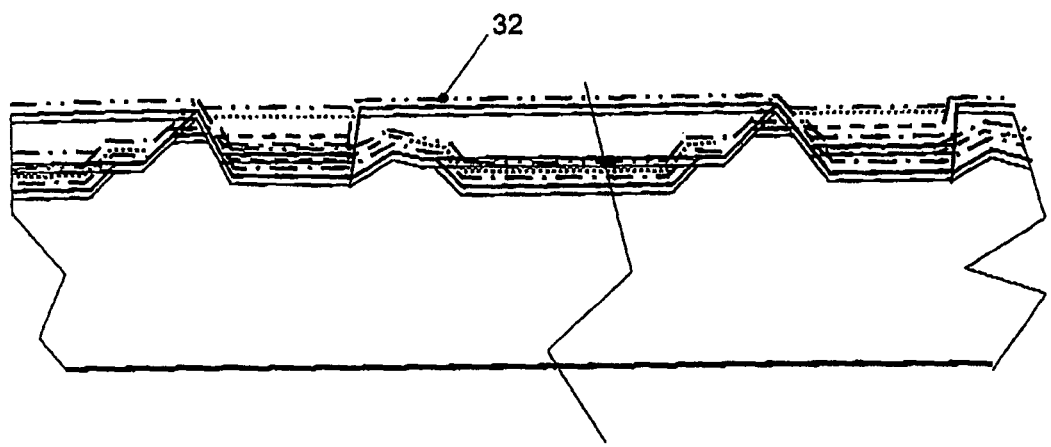
Figure 32:
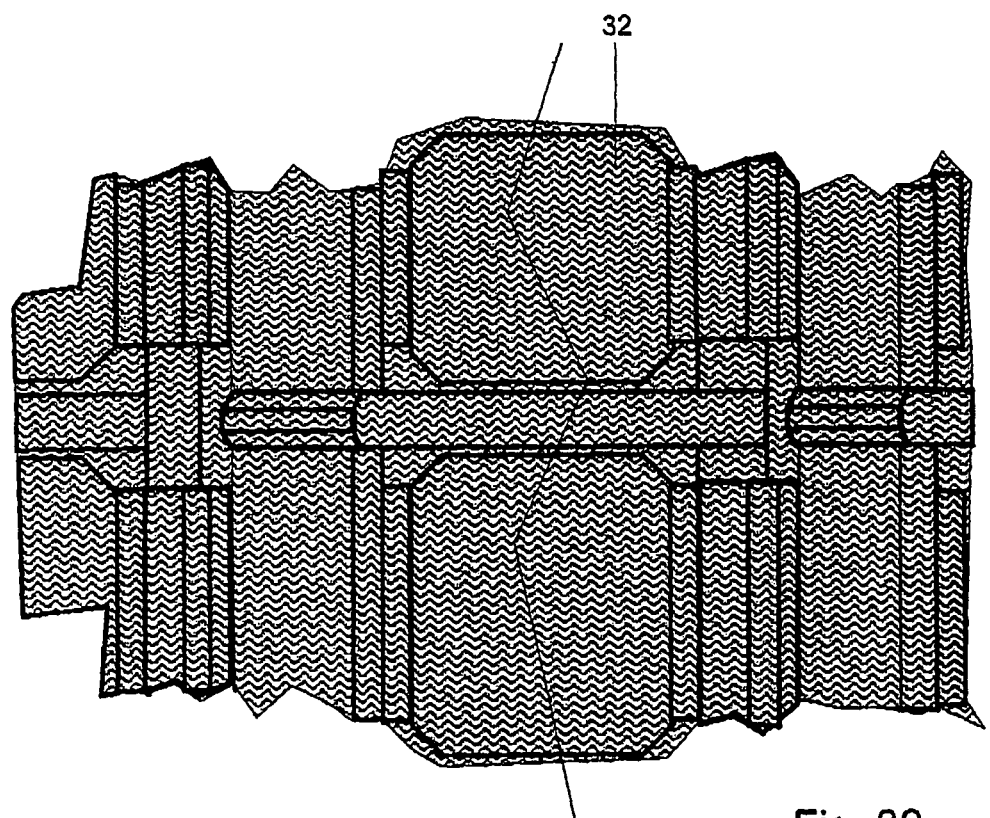

FIGS. 31 and 32 show that, thereupon, the entire substrate is covered with an electron injecting layer 32 such as, for instance, a calcium-, magnesium-, lithium fluoride- or barium-layer.

Figure 33:
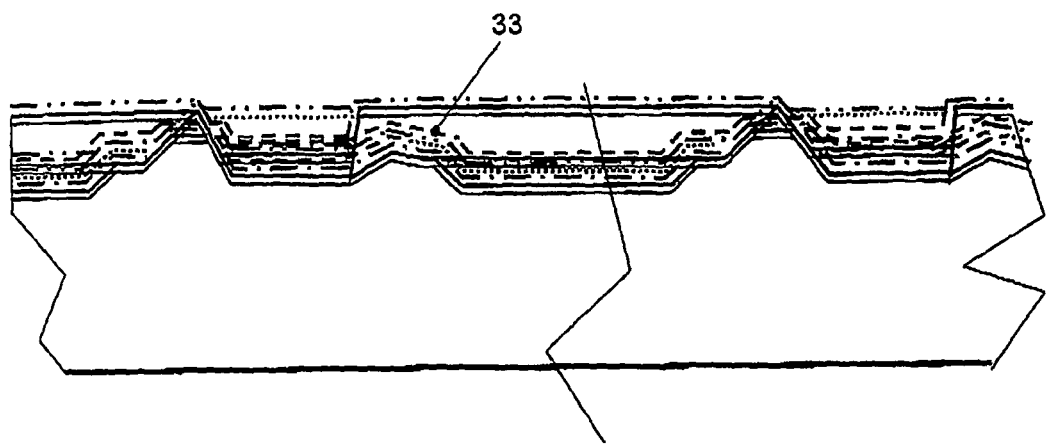
Figure 34:
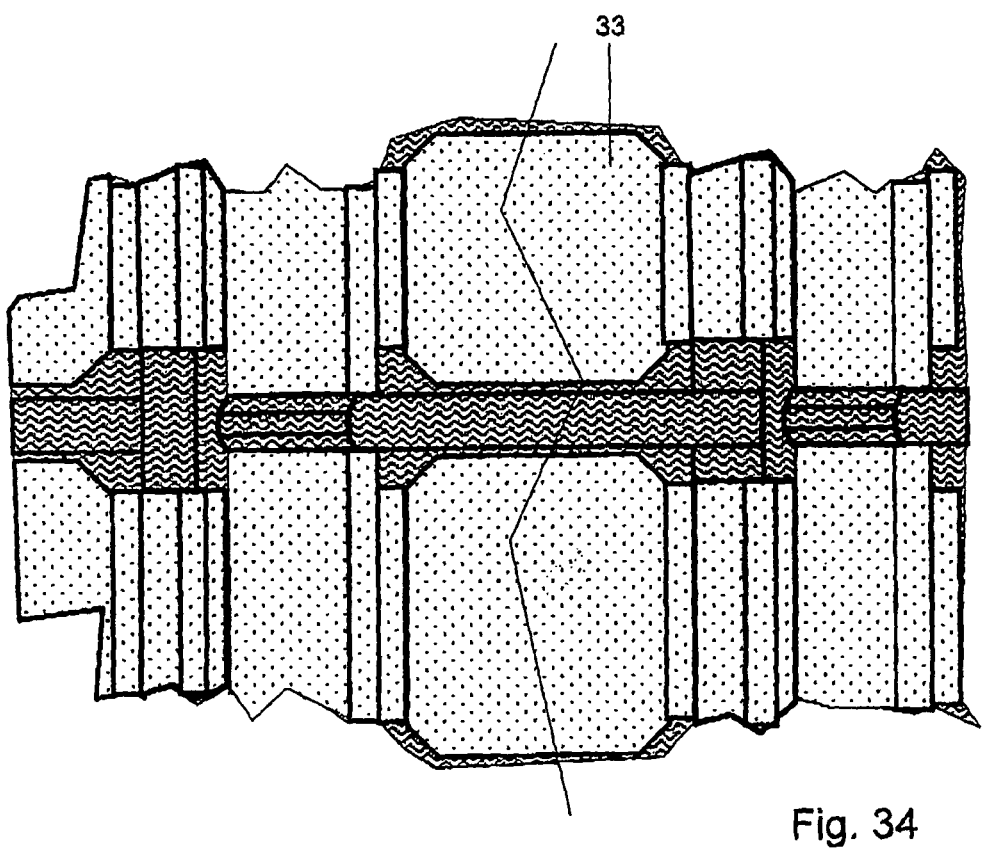

Subsequently, FIGS. 33 and 34 show that the second conductive layer 33 has been provided in the channels 31, for instance with the aid of an inkjet printing operation. The second conductive layer 33 provides a number of parallel conductors, mutually insulated from each other and extending in the second direction, while parts of the second conductors extend in pixel pits or sub-pixel pits 22 of the surface structure of the substrate 21.

Figure 35:
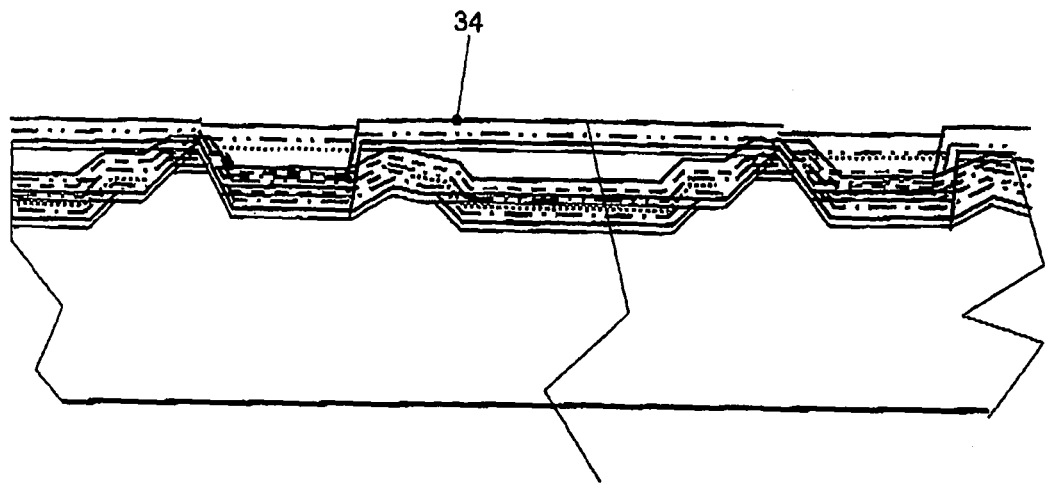
Figure 36:
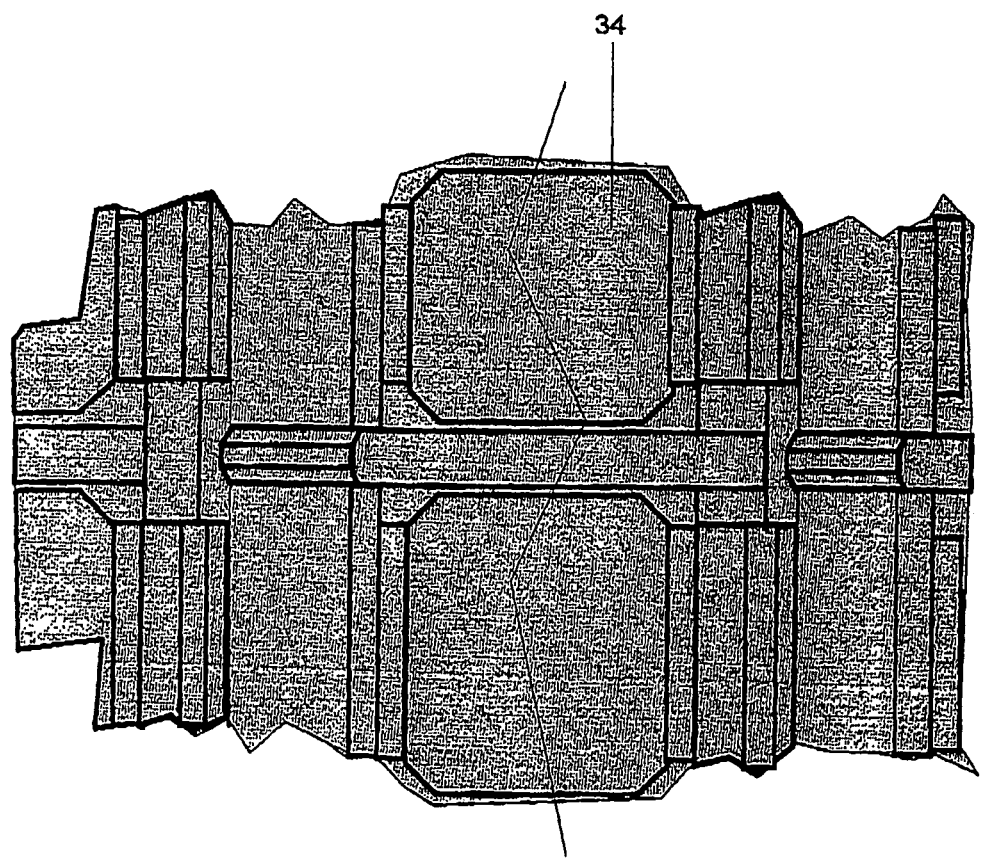

Finally, FIGS. 35 and 36 show that after the application of the second conductive layer, an encapsulation layer 34 is applied over substantially the entire surface of the substrate.

This layer too seals off from undesired substances such as, for instance, water, oxygen and the like. The layer can comprise, for instance, a Nitride-metal-Nitride layer, a NONON-layer or a NDLCN-layer (nitride diamond like carbon nitride).

Figure 37:
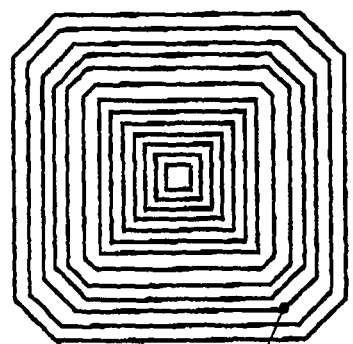
FIG. 37 shows a top plan view of the substrate, wherein a first structure which has been applied in a pixel pit is shown.

FIG. 37 shows a top plan view of a substrate wherein, in the pixel pits or sub-pixel pits, a structure 36 has been provided which influences the generated light passing the structure. In FIG. 37, the structure forms a Fresnel lens 35 which has a converging, diverging or, conversely, paralleling effect. It is noted that such a structure can also extend over several pixels, so that in a part of the eventual display, the issuing light is optically influenced. Such a structure can also be provided on the side of the substrate remote from the pixel pits.

Figure 38:
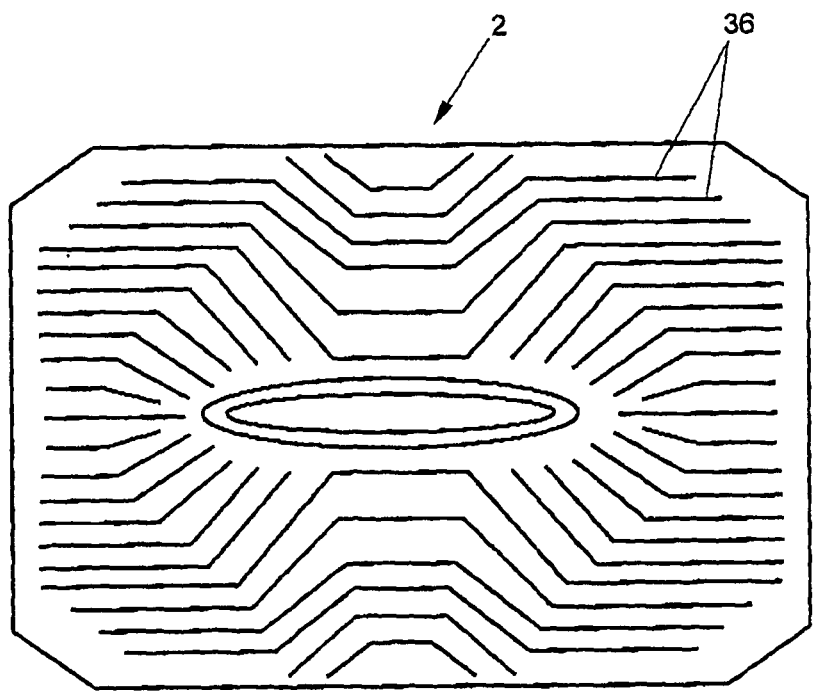
FIG. 38 shows a top plan view of the substrate, wherein a second structure which has been applied in a pixel put is shown.

FIG. 38 shows another structure 36 provided in the pixel pits or sub-pixel pits 2, 22, designed to improve the distribution of liquid for forming layers provided in the pixel pits or sub-pixel pits. Preferably, this structure 36 also has a contact surface enlarging effect. This can, for instance, be effected with a structure which is provided with capillary grooves. Such a larger contact surface not only reduces the electrical resistance, it also provides a larger light emitting surface, so that, also, more light is generated.

FIG. 39a shows, in cross section, once more, a substrate 1 with a shadowing structure 4. In FIG. 39b, it is shown how this structure can be melted away locally with the aid of a laser beam or infrared beam directed through a lens 37, which locally heats the shadowing structure 4 such that it melts, so that the shadowing structure 4 disappears.

It is clear that the invention is not limited to the exemplary embodiments described but that various modifications are possible within the framework of the invention as defined in the claims.

The invention claimed is:

1. A method for manufacturing an organic electroluminescent display device, comprising:
    providing a substrate that is manufactured from plastic by one of: injection molding, embossing or photopolymeric replication and having a surface structure including neighboring rows of pixel pits or sub-pixel pits, the surface structure forming a boundary for at least a number of layers which are applied;
    applying an arrangement of layers to the substrate such that first conductors extend in a first direction and second conductors extend in a second direction,
    providing between crossings of the first and second conductors an organic electroluminescent compound which, under the influence of a voltage, emits light,
    wherein the applying an arrangement of layers includes:
    applying a first conductive layer by a sputtering process,
    the surface structure of the plastic substrate further comprising a plurality of shadowing structures, wherein between two neighboring rows of pixel pits an associated one of the plurality of shadowing structures extends, wherein a said shadowing structure that extends between two neighboring rows of pixel pits includes a number of parallel, narrow and deep grooves, wherein the width and depth of the grooves is configured such that with the sputtering process, parts of the shadowing structure are substantially not covered with the first conductive layer and that the electrical resistance prevailing there is larger than the resistance in the rest of the first conductive layer.

2. A method according to claim 1, wherein the manufacture of the substrate comprises an injection molding process.

3. A method according to claim 2, wherein in the injection molding process use is made of an injection molding mold which is provided with a negative image of the desired surface structure of the substrate.

4. A method according to claim 1, wherein after the manufacture of the plastic substrate, a first transparent encapsulation layer is applied to the substrate.

5. A method according to claim 4, wherein the first transparent encapsulation layer is a nitride-oxide-nitride layer (NON-layer).

6. A method according to claim 4, wherein the first transparent encapsulation layer is applied by a deposition technique.

7. A method according to claim 6, wherein the deposition technique comprises a PVD, CVD or PECVD process.

8. A method according to claim 4, wherein after the application of the first transparent encapsulation layer, the first conductive layer is applied such that a number of parallel first conductors extending in the first direction are provided which are mutually insulated from each other by an insulator, wherein parts of the first conductors extend in the pixel pits or sub-pixel pits of the surface structure of the substrate.

9. A method according to claim 8, wherein after the application of the first conductive layer, at least in the pixel pits or sub-pixel pits, a hole injecting layer is applied.

10. A method according to claim 9, wherein after application of the hole injecting layer a light emitting layer is provided locally in at least the pixel pits or sub-pixel pits.

11. A method according to claim 9, wherein the hole injecting layer comprises a PDOT-layer.

12. A method according to claim 9, wherein the light emitting layer is a PPV layer.

13. A method according to claim 8, wherein at least those parts of the first conductive layer which are not covered with the organic electroluminescent compound and which, in a following process, will be covered by a second conductive layer, are provided with an insulating covering prior to said following process.

14. A method according to claim 13, wherein the insulating covering is applied with a printing operation.

15. A method according to claim 14, wherein the printing operation comprises inkjet printing.

16. A method according to claim 14, wherein the insulating covering is formed from a UV-curing varnish.

17. A method according to claim 14, wherein the deep grooves forming the shadowing structure are filled up with the insulating covering.

18. A method according to claim 13, wherein after application of the insulating covering, a second conductive layer is provided such that in a number of parallel second conductors are provided extending in a second direction and which are mutually insulated from each other, while parts of the second conductors extend in the pixel pits or sub-pixel pits of the surface structure of the substrate.

19. A method according to claim 18, wherein the second direction is perpendicular to the first direction.

20. A method according to claim 18, wherein the second conductive layer is applied with a printing process.

21. A method according to claim 20, wherein the printing process comprises inkjet printing, silkscreen printing, electrostatic printing, or thermal transfer printing.

22. A method according to claim 18, wherein the second conductive layer is applied in channels extending parallel to each other.

23. A method according to claim 18, wherein, prior to the application of the second conductive layer and after the application of the insulating covering, an electron injecting layer is applied to the substrate.

24. A method according to claim 23, wherein the electron injecting layer comprises a calcium, magnesium lithium fluoride, or barium layer.

25. A method according to claim 24, wherein the barium layer is applied with a PVD-process.

26. A method according to claim 18, wherein after the application of the second conductive layer at least one encapsulation layer is applied.

27. A method according to claim 8, wherein after application of the insulator, a relief structure is provided for forming channels extending parallel to each other, wherein the channel direction is perpendicular to said first direction in which the first conductors extend.

28. A method according to claim 1, wherein the first conductive layer forms a hole injecting layer in the pixel pits or sub-pixel pits.

29. A method according to claim 28, wherein the hole injecting layer comprises PDOT-layer.

30. A method according to claim 1, wherein the shape of the surface structure, after application of at least one layer, is adapted by a transforming technique.

31. A method according to claim 30, wherein the transforming technique is a local thermal treatment carried out by laser operation or by local infrared irradiation.

32. A method according to claim 1, wherein a relief structure is provided on the substrate already provided with a number of layers for the application of a following layer.

33. A method according to claim 32, wherein the relief structure is provided by a printing operation, while using a curing varnish.

34. A method according to claim 33, wherein the curing varnish comprises a UV curing varnish.

35. A substrate for use in manufacturing an organic electroluminescent display device, the substrate comprising a first conductive layer applied by a sputtering process, wherein the substrate comprises plastic manufactured by one of: injection molding, embossing or photopolymeric replication and has a surface structure forming a boundary for the first conductive layer, the surface structure comprising a number of pixel pits or sub-pixel pits and a plurality of shadowing structures adjacent at least one of the pixel pits, wherein between two neighboring rows of pixel pits an associated one of the plurality of shadowing structures extends, wherein a said shadowing structure that extends between two neighboring rows of pixel pits comprises a number of parallel, narrow and deep grooves, wherein the width and the depth of the grooves is such that with the puttering process, parts of the shadowing structure are substantially not covered with the first conductive layer, the shadowing structure being such that the electrical resistance prevailing there is larger than the resistance in the rest of the first conductive layer.

36. A substrate according to claim 35, wherein the surface structure is releasing such that it can be taken from a mold which is provided with a negative image of the surface structure.

37. A substrate according to claim 35, wherein the substrate is an injection molding product.

38. A substrate according to claim 35, wherein, in the pixel pits or sub-pixel pits, a structure is provided which influences generated light passing the structure.

39. A substrate according to claim 38, wherein the structure comprises a Fresnel lens.

40. A substrate according to claim 38, wherein the structure has a converging effect on the light issuing through the structure.

41. A substrate according to claim 38, wherein the structure has a diverging effect on the light issuing through the structure.

42. A substrate according to claim 35, wherein at a side of the substrate remote from the pixel pits or sub-pixel pits, a structure is provided which influences generated light passing the structure.

43. A substrate according to claim 35, wherein in the pixel pits or sub-pixel pits a structure is provided, configured to distribute liquid for forming the layers provided in the pixel pits or substantially-pixel pits.

44. A substrate according to claim 43, wherein the structure comprises capillary grooves.

45. A substrate according to claim 35, wherein in the pixel pits or sub-pixel pits a contact surface enlarging structure is provided.

46. An organic electroluminescent display device comprising a substrate according to claim 35.

\* \* \* \* \*

UNITED STATES PATENT AND TRADEMARK OFFICE
CERTIFICATE OF CORRECTION

| | | |
|---|---|---|
| PATENT NO. | : 8,591,277 B2 | Page 1 of 1 |
| APPLICATION NO. | : 10/540489 | |
| DATED | : November 26, 2013 | |
| INVENTOR(S) | : Peter Briër et al. | |

It is certified that error appears in the above-identified patent and that said Letters Patent is hereby corrected as shown below:

On title page, item (73) Assignee:
replace "OTB Group B.V. (NL)"
with – OLED TECHNOLOGIES & SOLUTIONS B.V. (NL) –

Signed and Sealed this
Seventeenth Day of June, 2014

Michelle K. Lee
*Deputy Director of the United States Patent and Trademark Office*

UNITED STATES PATENT AND TRADEMARK OFFICE
CERTIFICATE OF CORRECTION

PATENT NO. : 8,591,277 B2  Page 1 of 1
APPLICATION NO. : 10/540489
DATED : November 26, 2013
INVENTOR(S) : Briër et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 2321 days.

Signed and Sealed this
Twenty-second Day of September, 2015

Michelle K. Lee
*Director of the United States Patent and Trademark Office*